United States Patent [19]

Schoberl

[11] 3,855,606

[45] Dec. 17, 1974

[54] SEMICONDUCTOR ARRANGEMENT

[75] Inventor: Werner Schoberl, Heilbronn, Germany

[73] Assignee: Licentia Patent-Verwaltungs-GmbH, Frankfurt/Main, Germany

[22] Filed: Dec. 12, 1972

[21] Appl. No.: 314,446

[30] Foreign Application Priority Data

Dec. 23, 1971 Germany .......... 2164092
Dec. 23, 1971 Germany .......... 7148428

[52] U.S. Cl. .......... 357/17, 357/72, 357/74, 357/75

[51] Int. Cl. .......... H01l 3/00, H01l 5/00

[58] Field of Search .......... 317/234, 4, 4.1, 3, 3.1, 317/235, 27

[56] References Cited

UNITED STATES PATENTS

| | | | |
|---|---|---|---|
| 3,387,190 | 6/1968 | Winkler | 317/234 |
| 3,416,036 | 12/1968 | Ho | 317/234 H |
| 3,609,475 | 9/1971 | Kaposhilin | 317/234 E |
| 3,617,819 | 11/1971 | Boisvert | 317/234 R |
| 3,644,802 | 2/1972 | Dingwall | 317/235 R |
| 3,665,263 | 5/1972 | Akiyama | 317/235 R |
| 3,702,977 | 10/1971 | Olsson | 317/234 G |
| 3,711,789 | 1/1973 | Dierschke | 317/235 N |
| 3,713,006 | 1/1973 | Litty et al. | 317/234 G |

FOREIGN PATENTS OR APPLICATIONS

| | | | |
|---|---|---|---|
| 1,026,164 | 4/1966 | Great Britain | 317/234 F |

*Primary Examiner*—Andrew J. James
*Attorney, Agent, or Firm*—Spencer & Kaye

[57] ABSTRACT

A semiconductor arrangement comprises two feed lines leading into a housing, a semiconductor diode connecting to one feed line and resistance means connected to the other feed line, the diode and the resistance means being also connected together in series.

10 Claims, 2 Drawing Figures

SEMICONDUCTOR ARRANGEMENT

The invention relates to a semiconductor arrangement comprising a semiconductor diode and one or more resistors which are accommodated in a common housing.

Semiconductor diodes are known which are driven in the conducting direction and in so doing emit visible or invisible light. The operating voltage of such components is for example of the order of magnitude of 1.6 volts.

SUMMARY OF THE INVENTION

It is an object of the present invention to provide a semiconductor arrangement which can be connected to supply voltage sources, the voltage value of which differs from the operational voltage of the diodes.

According to the invention, there is provided a semiconductor arrangement comprising a housing, first and second feed lines leading into said housing, a semiconductor diode connected to said first feed line within said housing, electrical resistor means connected to said second feed line within said housing and means for connecting said resistance means to said diode to connect said diode and a resistance of said resistance means in series.

BRIEF DESCRIPTION OF THE DRAWINGS

The invention will now be described in greater detail, by way of example, with reference to the drawing, in which.

DESCRIPTION OF THE PREFERRED EMBODIMENT

In a semiconductor arrangement comprising a semiconductor diode and one or more resistors accommodated in a common housing, the invention proposes that two housing feed lines lead into the housing, that the semiconductor diode is connected to one of the housing feed lines in the housing, whereas the electrical resistance or the electrical resistance network is connected to the other feed line and that the diode is so connected to the resistor(s) that at least one resistor is connected in series to the diode.

The arrangement in accordance with the invention has the substantial advantage that two components which form a series circuit of at least one resistor and a diode can be inserted into a conventional diode housing without changing the number of feed lines or the inner geometrical construction.

According to the choice of the upstream-connected resistor, a supply voltage can now be applied to the luminous or radiation diode, which voltage differs from the operating voltage of the diode. The resistance is in this case preferably so chosen that the optimal operating voltage decreases at the diode driven in the conducting direction, whereas the difference between diode operating voltage and supply voltage decreases at the resistor.

In a further development in accordance with the invention, provision is made for the two housing feed lines to be flattened at their ends arranged in the housing interior. The semiconductor body containing the diode is secured to the front face, thus formed, of one feed line, whereas a support body is secured to the front face of the other feed line, on which support body one or more resistors are arranged. The diode and the resistor network are thermally decoupled so that both components cannot influence each other.

Several serially-connected resistors are preferably arranged on the carrier body. The ends of the resistor chain thus formed and the connections between each two resistors are in electrical connection with wire connection surfaces on the carrier body, so that there is the possibility, before the contacting, in each case, to select according to the foreseen application, how many of the resistors present are to be connected in series with the diode.

The resistors can comprise resistance paths diffused into a semiconductor body. The resistors, however, can also comprise metallic resistance material which is evaporated or deposited in any other way on a carrier body which is insulating at least at its upper surface. The semiconductor bodies or carrier bodies can be glued or soldered to the feed line underlay.

Figure 1:
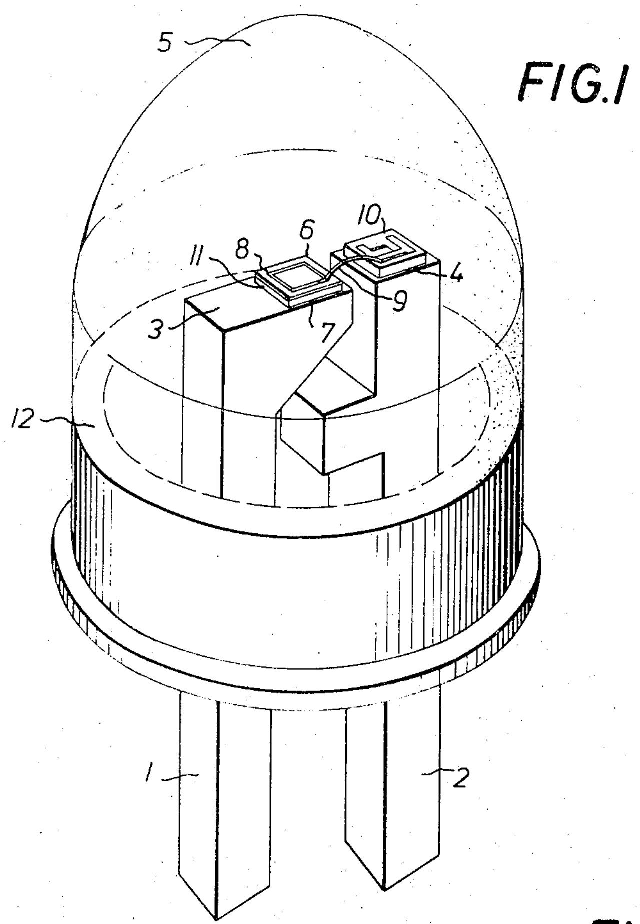
FIG. 1 shows, in perspective view, a housing for a luminous diode.

Referring now to the drawings, a housing for a luminous diode is shown in FIG. 1. The housing comprises a housing socket 12 which, for example, is a metal ring filled with plastic. Two housing feed lines 1 and 2, which are flattened at their front face ends (e.g., 3), are led through this housing socket. A diode body 6 is secured to the front face 3 of the feed line 1. This diode body comprises for example a multi-constituent semiconductor material; to produce red light, for example, a semiconductor body of gallium-arsenide-phosphide is used. The semiconductor body is provided on its reverse side with a metal contact 7 which is glued or soldered, on the front face 3 of the feed line 1 to form a resistive i.e., an ohmic, contract. A pn-junction 11 runs in the semiconductor body. The extremely thin upper surface region of the semiconductor body is provided with a contact 8 which covers only a small part of the upper surface, so that the radiation coming from the pn-junction can pass practically unhindered through the upper surface.

A carrier body 10 containing the resistors is secured to the front surface of the other feed line 2. This carrier body is preferably so constructed that one end of the resistor or of the resistor chain is electrically connected to the feed line. If the carrier body 10 comprises a conducting material, the underside of this carrier body is preferably provided with a metallic contact 4, with which the carrier body is secured to the feed line and forms a resistive contact. The other end of the resistor, of the resistor chain or of a connection between two resistors is then electrically conductively connected through a thin feed line wire to the front face contact 8 of the diode 6.

Figure 2:
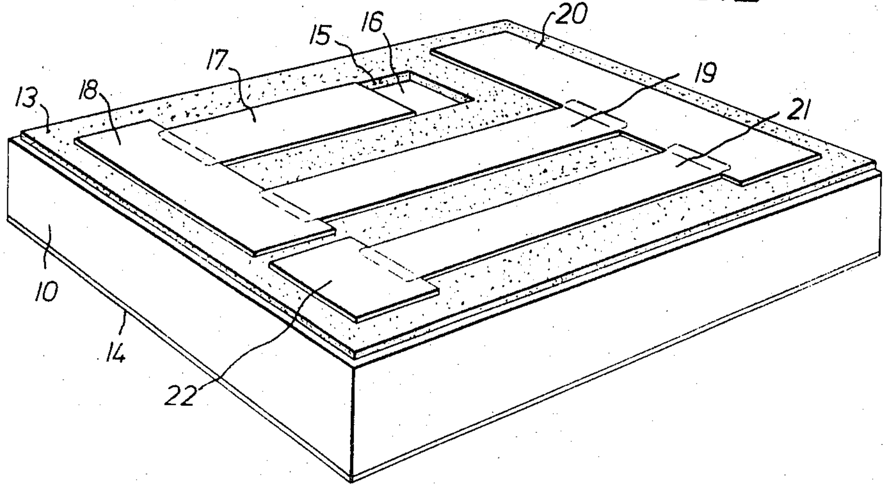
FIG. 2 shows, also in perspective view an embodiment of a resistance network.

A particularly advantageous embodiment of the resistance network is shown in FIG. 2. The carrier body 10 comprises, for example, an electrically conducting semiconductor material. The upper surface of the semiconductor body is covered with an insulating layer 13 on the front face. The semiconductor body can, for example, be comprised of silicon, and the insulating layer can be comprised of silicon dioxide. Three connecting resistors 17, 19 and 21 which, for example are vapour deposited are located on this insulating layer in the exemplary embodiment illustrated. The resistors are connected in series through the connecting contacts 18 and 20. An opening 15 was made in the insulating layer, by which the one end of the resistor 17 which is simultaneously the end of the resistance chain is electrically conductively connected through the connection area 16 to the semiconductor body. The current path then leads through the conducting semiconductor material and the rear connection 14 to the housing feed line 2 (FIG. 1). The connectnig wire 9 to the diode 6 can now be connected once to the surface 18; then the diode is connected in series with the resistor 17. With another possible supply voltage the wire 9 is connected to the contact surface 20 or to the contact surface 22. In the first case, the resistors 17 and 19 are connected in series with the diode, and in the second case the resistors 17, 19 and 21.

In one embodiment the resistors can, for example, have the following values:

Resistor 17: 330 ohms.
Resistor 19: 670 ohms.
Resistor 21: 1.7 kOhms.

Starting from an arrangement with these resistance values, this arrangement is suitable, with a connection of the diode to the contact 18, for voltage values between 4 and 6 volts, with a connection of the diode to the contact 20 for voltage values between 7 and 14 volts, and with a connection of the diode to the contact 22 for supply voltage values between 15 and 30 volts. The operating current in this case amounts to about 10mA.

Advantageously, it will be so started that, in each case, a part of the manufacture is constructed for the different supply voltages. A customer needs only inform the manufacturer at which voltage he wants to or must operate the luminous diode, and then the diodes are picked out of the assortment present, which diodes are connected in series with a resistor of suitable size.

It is obvious that any number of possible resistors of differing size can be accommodated on the carrier body or in the carrier body.

The housing in which both components are accommodated is subsequently, as is shown in FIG. 1, embedded in a light-permeable plastics mass 5.

It will be understood that the above description of the present invention is susceptible to various modification changes and adaptations.

What is claimed is:

1. A semiconductor luminous diode arrangement for connection to voltage supply sources whose output voltage differs from the actual operating voltage of the diode comprising a diode housing having first and second feed lines leading into said housing, a semiconductor luminous diode electrically connected to said first feed line within said housing, electrical resistor means electrically connected to said second feed line within said housing, and means for connecting said resistor means to said diode to connect said diode and a resistance of said resistor means in series between said first and second feed lines.

2. A semiconductor arrangement as defined in claim 1 wherein said resistor means comprises a resistance network.

3. A semiconductor arrangement as defined in claim 1, and further comprising flattened ends for each of said first and second feed lines within said housing, a semiconductor body including said diode mounted on said flattened end of said first feed line and a carrier body including said resistor means mounted on said flattened end of said second feed line.

4. A semiconductor arrangement as defined in claim 3 wherein said resistor means includes a plurality of series connected resistors on said carrier body in a resistor chain and wire connection surfaces on said carrier body in electrical connection with the ends of said resistor chain and with the series connections between said resistors.

5. A semiconductor arrangement as defined in claim 4, further comprising means for electrically connecting one end of said resistor chain to said second feed line and wherein said means for connecting connects another part of said resistor chain to said diode.

6. A semiconductor arrangement as defined in claim 5, wherein said means for connecting comprises a thin wire.

7. A semiconductor arrangement as defined in claim 5, wherein: said carrier body comprises an electrically conductive semiconductor body having an insulating layer on the face of said semiconductor body away from said second feed line; said resistors lie on the surface of said insulating layer; and said means for electrically connecting one end of said resistor chain includes, means for connecting one end of said resistor chain through an aperture in said insulating layer to said semiconductor body and means for securing said semiconductor body resistively to said second feed line.

8. A semiconductor arrangement as defined in claim 6, and further comprising glue fo r glueing said two semiconductor bodies to said feed lines.

9. A semiconductor arrangement as defined in claim 7, wherein said means for resistively securing said semiconductor body comprises solder and further comprising solder for soldering said semiconductor body including said diode to said first feed line.

10. A semiconductor arrangement as defined in claim 1 wherein said resistance has a value such that the proper operating voltage will be applied to said diode when said feed lines are connected to a voltage supply source of predetermined output voltage.

* * * * *